United States Patent
Cheng et al.

(10) Patent No.: US 9,735,364 B2
(45) Date of Patent: Aug. 15, 2017

(54) OLED DISPLAY DEVICE AND PREPARATION METHOD THEREOF, DISPLAY APPARATUS

(71) Applicant: BOE TECHNOLOGY GROUP CO., LTD., Beijing (CN)

(72) Inventors: Hongfei Cheng, Beijing (CN); Yong Qiao, Beijing (CN); Yongchun Lu, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,286

(22) PCT Filed: Oct. 24, 2014

(86) PCT No.: PCT/CN2014/089430
§ 371 (c)(1),
(2) Date: Aug. 20, 2015

(87) PCT Pub. No.: WO2016/019635
PCT Pub. Date: Feb. 11, 2016

(65) Prior Publication Data
US 2016/0254454 A1    Sep. 1, 2016

(30) Foreign Application Priority Data
Aug. 5, 2014   (CN) .......................... 2014 1 0381309

(51) Int. Cl.
*H01L 51/52* (2006.01)
*H01L 51/00* (2006.01)
*H01L 27/32* (2006.01)

(52) U.S. Cl.
CPC .......... *H01L 51/0023* (2013.01); *H01L 27/32* (2013.01); *H01L 27/3244* (2013.01); *H01L 51/5206* (2013.01); *H01L 51/5221* (2013.01)

(58) Field of Classification Search
CPC . H01L 51/52; H01L 51/5265; H01L 51/5206; H01L 51/5221; H01L 51/5256; H01L 51/5012
See application file for complete search history.

(56) References Cited

U.S. PATENT DOCUMENTS 9,024,415 B2    5/2015 Zhang et al.
2007/0254184 A1* 11/2007 Domoto .............. H01L 51/5218
                                                        428/690

(Continued)

FOREIGN PATENT DOCUMENTS

CN     103238101 A     8/2013
CN     103413594 A    11/2013

(Continued)

OTHER PUBLICATIONS

Second Chinese Office Action in Chinese Application No. 201410381309.X mailed Jun. 29, 2016 with English translation.

(Continued)

*Primary Examiner* — Phuc Dang
(74) *Attorney, Agent, or Firm* — Collard & Roe, P.C.

(57) ABSTRACT

An organic light emitting diode (OLED) display device and a preparation method thereof, and a display apparatus are disclosed. The OLED display device includes a base substrate (21), an anode (23), a cathode (26) and an organic functional layer (25), the anode (23), the cathode (26) and the organic functional layer (25) formed on the base substrate (21), and the organic functional layer (25) located between the cathode (26) and the anode (23), the anode (23) and/or the cathode (26) being a topological insulator with a two-dimensional nanostructure, and the topological insula- (Continued)

tor with the two-dimensional nanostructure being adhered on the base substrate (21) by an adhesive layer. The OLED display device overcomes the problem of non-uniform display lightness which is caused by the high transmission resistance and high IR drop of metal electrodes of OLED display devices.

13 Claims, 2 Drawing Sheets

(56) References Cited

U.S. PATENT DOCUMENTS

| | | | | |
|---|---|---|---|---|
| 2008/0074859 | A1* | 3/2008 | Kitayama | G02B 5/045 |
| | | | | 362/19 |
| 2012/0261684 | A1* | 10/2012 | Koshihara | H01L 51/5265 |
| | | | | 257/89 |
| 2013/0004753 | A1 | 1/2013 | Majumdar et al. | |
| 2013/0341612 | A1* | 12/2013 | Oohisa | C07D 209/86 |
| | | | | 257/40 |
| 2014/0110680 | A1 | 4/2014 | Choe | |

FOREIGN PATENT DOCUMENTS

| | | |
|---|---|---|
| CN | 103489894 A | 1/2014 |
| CN | 103779384 A | 5/2014 |
| CN | 103943649 A | 7/2014 |
| KR | 10-2012-0079310 A | 7/2012 |

OTHER PUBLICATIONS

International Search Report of of PCT/CN2014/089430 in Chinese, mailed May 11, 2015 with English translation.
Notice of Transmittal of the International Search Report of PCT/CN2014/089430 in Chinese, mailed May 11, 2015.
Written Opinion of the International Searching Authority of PCT/CN2014/089430 in Chinese, mailed May 11, 2015 with English translation.
Peng et al. (2012). "Topological insulator nanostructures for near-infrared transparent flexible electrodes." Nature Chemistry, 4(4), pp. 281-286.
Chinese Office Action in Chinese Application No. 201410381309.X mailed Jan. 29, 2016 with English translation.

* cited by examiner

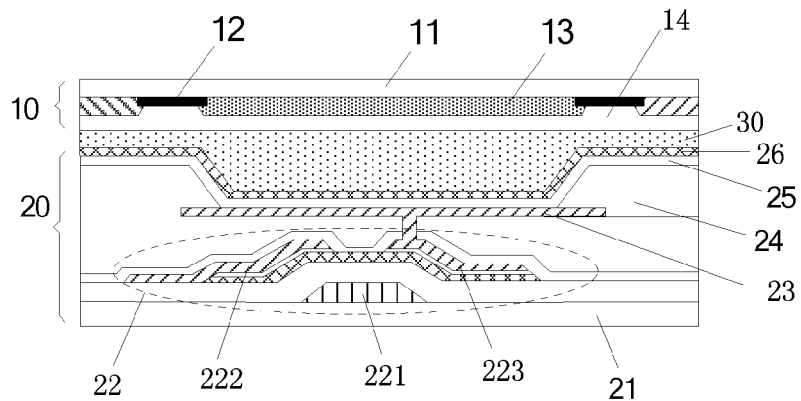

Fig. 1

| Forming a topological insulator into an anode pattern and/or a cathode pattern with a two-dimensional nanostructure | S101 |

| forming an anode, an organic functional layer and a cathode, wherein forming of the anode and/or cathode is conducted by adhering the anode pattern and/or the cathode pattern on the correspondent anode zone and/or cathode zone by an adhesive layer. | S102 |

Fig. 2

| etching to pattern a substrate to form a pattern corresponding to the cathode. | S1011 |

| forming a thin film of the topological insulator with a two-dimensional nanostructure on the surface of the substrate that is patterned. | S1012 |

| removing the substrate to obtain the cathode pattern. | S1013 |

Fig. 3

OLED DISPLAY DEVICE AND PREPARATION METHOD THEREOF, DISPLAY APPARATUS

CROSS REFERENCE TO RELATED APPLICATIONS

This application is the National Stage of PCT/CN2014/089430 filed on Oct. 24, 2014, which claims priority under 35 U.S.C. §119 of Chinese Application No. 201410381309.X filed on Aug. 5, 2014, the disclosure of which is incorporated by reference.

TECHNICAL FIELD

The embodiments of the present invention relate to an organic light emitting diode (OLED) display device and a preparation method thereof, and a display apparatus.

BACKGROUND

Organic light emitting diode (OLED) display device is a new generation of display and has many advantages, such as self-illumination, rapid response speed, wide viewing angle, etc., in comparison with liquid crystal display, and thus can be used for flexible display, transparency display, 3D display, etc. Organic light emitting diode comprises an anode, a cathode and an organic functional layer. The main operation principle of the organic light emitting diode is that the current carriers driven by an electric field formed by the anode and the cathode are injected into the organic functional layer and complexed therein, thereby emitting light.

The cathode of the organic light emitting diode is typically made of a thin layer of metallic silver, and the anode is typically made of indium tin oxide (ITO). Both thin layer metallic silver and ITO have a high electrical resistivity. Especially for large area formed cathode, the cathode prepared from a thin layer of metallic silver has a relatively high electrical resistivity and a relatively high internal resistance drop (IR drop), resulting in a relatively great difference between the actual driving voltage of the OLED device and the supply voltage. Thus in a large-scale OLED display, there would be a large area with non-uniform lightness, and the display effect would be influenced.

SUMMARY

At least one embodiment of the present invention provides an OLED display device and a preparation method thereof, and a display apparatus, thereby avoiding the problem of large transmission resistance of the cathode and anode in the OLED display device.

At least one embodiment of the present invention provides an OLED display device, which comprises a base substrate, an anode, a cathode, and an organic functional layer, the anode, the cathode, and the organic functional layer being formed on the base substrate, and the organic functional layer being located between the cathode and the anode, the anode and/or the cathode comprising a topological insulator with a two-dimensional nanostructure, and the topological insulator with the two-dimensional nanostructure being adhered on the base substrate by an adhesive layer.

At least one embodiment of the present invention provides a method for preparing an OLED display device, which comprises: forming a topological insulator into an anode pattern and/or a cathode pattern with a two-dimensional nanostructure; forming an anode, an organic functional layer and a cathode, wherein, forming of the anode and/or the cathode is conducted by adhering the anode pattern and/or the cathode pattern on the correspondent anode zone and/or cathode zone by an adhesive layer.

At least one embodiment of the present invention provides a display apparatus, which comprises any OLED display device provided by the embodiments of the present invention.

BRIEF DESCRIPTION OF THE DRAWINGS

In order to illustrate the technical solutions of the embodiments of the present invention more clearly, the figures of the embodiments are briefly described below. Apparently, the figures described below merely relate to some embodiments of the present invention rather than are limitative of the present invention.

FIG. 1 is a schematic diagram of an OLED display device;

FIG. 2 is a schematic diagram of a method for preparing an OLED display device provided by an embodiment of the present invention;

FIG. 3 is a schematic diagram of a method for forming a topological insulator into a cathode pattern with a two-dimensional nanostructure provided by an embodiment of the present invention.

REFERENCE SIGNS ON THE FIGURES

Figure 4:
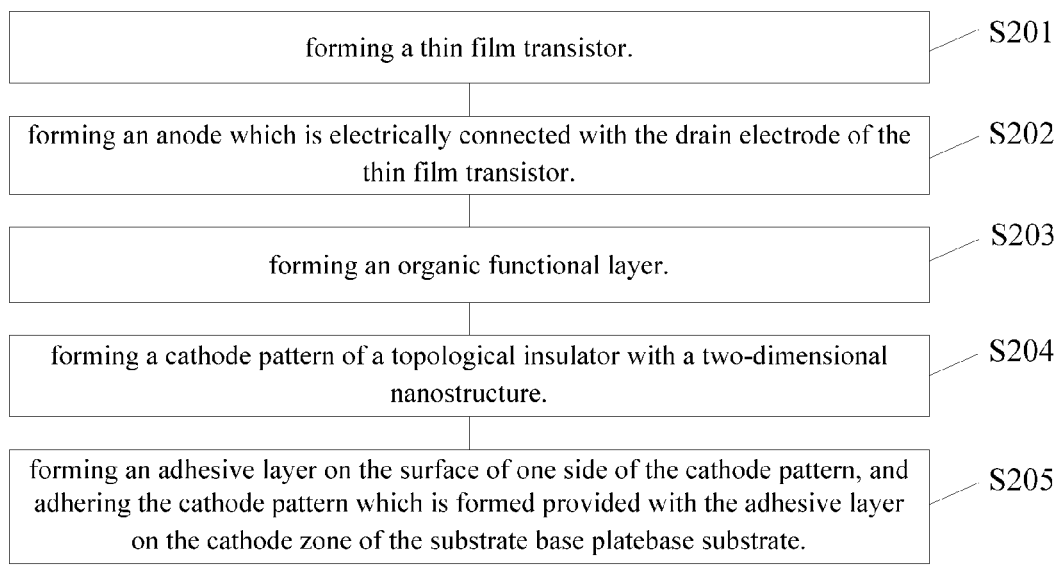
FIG. 4 is a schematic diagram of a method for preparing an OLED display device provided by another embodiment of the present invention.

10—package substrate; 11—second base substrate; 12—black matrix layer; 13—color filter layer; 14—over coat; 20—array substrate; 21—first base substrate; 22—thin film transistor; 221—gate electrode; 222—source electrode; 223—drain electrode; 23—anode; 24—pixel definition layer; 25—organic functional layer; 26—cathode; 30—packed layer.

DETAILED DESCRIPTION

To make the object, technical solutions, and advantages of the embodiments of the present invention clearer, the technical solutions of the embodiments of the present invention will be described below in a clearer and complete way with reference to the figure of the embodiments of the present invention. Apparently, the embodiments described are only part, rather than all of the embodiments of the present invention. Based on the embodiments of the present invention described, all the other embodiments obtained by a person of ordinary skills in the art without paying inventive work fall into the scope of protection of the present invention.

An OLED display device is shown in FIG. 1. The OLED display device comprises an array substrate 20 and a package substrate 10 which are assembled. The array substrate 20 comprises a first base substrate 21, a thin layer transistor 22 comprising a gate electrode 221, a source electrode 222 and a drain electrode 223; an anode 23 connected with the drain electrode 223 of the thin layer transistor 22, an organic functional layer 25 located on the anode 23, and a cathode 26 located on the organic functional layer 25. The package substrate 10 comprises a second base substrate 11, a color filter layer 13, a black matrix layer 12 and an over coat 14. A packed layer (filler) 30 are arranged between the array substrate 20 and the package substrate 10. The organic functional layer 25 may be further classified into: hole transport layer (HTL), light emitting layer (EML), electron transport layer (ETL), etc.

A topological insulator is a new physical state proposed in recent years. The topological insulator has a bulk energy band structure that is the same as a bulk energy band structure of ordinary insulators, that is, an energy gap of a limited size exists at the Fermi energy level. However, on the boundary or the surface of a topological insulator, a Dirac type spin non-degeneration electro-conductive marginal state without an energy gap exists; this state is a unique property different from the ordinary insulators. This electro-conductive marginal state exists stably. Information may be transmitted by the spin of an electron, rather than by electric charge like conventional materials. Therefore, a topological insulator has a better electro-conductive performance and is not dissipative, that is, does not generate heat.

At least one embodiment of the present invention provides an OLED display device, which comprises: a base substrate, an anode, a cathode, and an organic functional layer, the anode, the cathode, and the organic functional layer formed on the base substrate, and the organic functional layer located between the cathode and the anode, wherein the anode and/or the cathode comprises a topological insulator with a two-dimensional nanostructure, and the topological insulator with the two-dimensional nanostructure is adhered on the base substrate by an adhesive layer. The base substrate may be a prime substrate on which functional structures has not been formed, or a substrate on which an array structure comprising thin film transistors has been formed.

What needs to be explained is that the expression "the anode and/or the cathode comprises a topological insulator with a two-dimensional nanostructure" comprises the following cases: only the anode comprises a topological insulator with a two-dimensional nanostructure; only the cathode comprises a topological insulator with a two-dimensional nanostructure; and both the anode and the cathode comprise topological insulators with a two-dimensional nanostructure.

The topological insulator with a two-dimensional nanostructure is a film with a nanoscale thickness formed from the topological insulator, and may be the following matters formed from the topological insulator: a two-dimensional nanoscale film, a two-dimensional nanoscale sheet, a two-dimentional nanoscale tape, etc.

The embodiments of the present invention provide an OLED display device and a preparation method thereof, and a display apparatus. The anode and/or cathode of the OLED display device is/are a topological insulator with a two-dimensional nanostructure. The topological insulator with a two-dimensional nanostructure has an ultrahigh specific surface area and an adjustable energy band structure, can reduce the proportion of bulk carriers and highlight the topological surface state significantly, and thus has a better electro-conductive performance.

When the anode and/or cathode of the OLED display is a topological insulator with a two-dimensional nanostructure, the anode and/or cathode has a low transmission resistance, which especially can improve the uniformity of a large-area electrode formed integrally, thereby improving the brightness uniformity of the OLED display device and enhancing the display effect.

What needs to be explained is that the topological insulator with a two-dimensional nanostructure has a similar structure as grapheme and thus has a relative high flexibility and a high transmissibility which is substantially invisible to naked eyes; therefore it is very suitable for a display device.

For example, the topological insulator comprises at least one of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, monolayer tin, and a variant material of monolayer tin.

$Ge_1Bi_4Te_7$, $Ge_2Bi_2Te_5$ and $Ge_1Bi_2Te_4$ belong to chalcogenides. AmN and PuTe belong to a topological insulator with a strong interaction. Of course, the topological insulator also may be a ternary Heusler's compound or other material.

More specifically, the topological insulator comprises, such as, at least one of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, monolayer tin, and a variant material of monolayer tin. That is, the topological insulator may be HgTe or $Bi_xSb_{1-x}$, or $Sb_2Te_3$ or $Bi_2Te_3$ or $Bi_2Se_3$ or $T_1BiTe_2$ or $T_1BiSe_2$ or $Ge_1Bi_4Te_7$ or $Ge_2Bi_2Te_5$ or $Ge_1Bi_2Te_4$ or AmN or PuTe or monolayer tin or a variant material of monolayer tin. Alternatively, the topological insulator may be a mixed material formed from two or more of the above materials, such as, may be mixed materials formed from two of the above materials. Of course, the topological insulator may be a mixed material formed from three of the above materials, etc. Furthermore, when the topological insulator is a mixed material formed from at least two of the above materials, materials having complementary properties may be selected to be mixed, thereby improving the property of the mixed material.

In at least one embodiment of the present invention, the topological insulator may be monolayer tin or a variant material of monolayer tin. Monolayer tin is a two-dimensional material having a thickness of only one tin atom. The atom layer thickness makes the monolayer tin has a good light transmissibility. Similar as graphene, monolayer tin has good toughness and high transmissibility.

The electrical conductivity of a monolayer of tin atoms can reach 100% at room temperature, thus the monolayer tin atoms can become a super conductor material. Specifically, the variant material of monolayer tin is formed by surface-modifying or magnetic-doping the monolayer tin. The surface-modifying of monolayer tin may be adding a functional group such as —F, —Cl, —Br, —I, —OH and the like to monolayer tin to achieve the modification.

In at least one embodiment of the present invention, the variant material of monolayer tin is tin fluorine compound formed by surface-modifying the monolayer tin with fluorine atoms. When fluorine atoms are added into the atomic structure of the monolayer tin, the electrical conductivity of the monolayer tin can reach 100% at a temperature up to 100° C., while the property of the monolayer tin is still stable.

In at least one embodiment of the present invention, the display device further comprises a thin film transistor which comprises a gate electrode, a source electrode and a drain electrode. The cathode is connected electrically with the drain electrode of the thin film transistor, and the anode comprises a topological insulator with a two-dimensional nanostructure; alternatively, the anode is connected electrically with the drain electrode of the thin film transistor, and the cathode comprises a topological insulator with a two-dimensional nanostructure.

In a display device shown in FIG. 1, the anode 23 connected electrically with the drain electrode 223 of the thin film transistor 22 is conductive metal oxide ITO, the cathode 26 is metal Ag. During the preparation of a display element, the electrode connected electrically with the drain electrode is typically formed in a small area so as to form a plurality of pixels. The anode 23 shown in FIG. 1 is typically a pixel electrode having a small area. The electrode which is not connected electrically with the thin film transistor is typically formed in large area, which is used as a common electrode. That is, the cathode 26 shown in FIG. 1 is typically a common electrode formed in large area. As for an electrode formed in large area, large electrical resistant results in a high IR drop of the electrode, thus the actual driving voltage of the light emitting element differs largely from the supply voltage, which is expressed as a non-uniform luminance in a large area. Therefore, in at least one embodiment of the present invention, the electrode which is not connected electrically with the thin film transistor is a topological insulator. In this way, the electrical conductivity of the large area electrode can be improved to reduce the difference between the actual driving voltage of the light emitting element and the supply voltage.

The thin film transistor comprises a gate electrode, a source electrode and a drain electrode, which are three electrodes of the thin film transistor. Thin film transistors can be classified into two types according to the position relations of these electrodes. The first type is the thin film transistor 22 as shown in FIG. 1, in which the gate electrode 221 is located below the source electrode 222 and the drain electrode 223, thus this type is known as the bottom-gate thin film transistor. In the other type, the gate electrode is located above the source electrode and the drain electrode, thus this type is known as the top-gate thin film transistor. The thin film transistor of the display device provided by at least one embodiment of the present invention may be a bottom-gate or top-gate thin film transistor.

What needs to be explained is that the OLED display device may be one as shown in FIG. 1, which further comprises other thin film or layer structures, such as pixel definition layer 24, a packed layer 30 between the array substrate 20 and the package substrate 10, etc. In the embodiments of the present invention, only those thin film or layer structures relevant to the embodiments of the present invention are listed. Reference can be made to the prior art for the specific arrangement of an OLED display, which is not specifically limited by the present invention.

At least one embodiment of the present invention provides a display apparatus, which comprises any OLED display device provided by at least one embodiment of the present invention. The display apparatus may be an OLED display and other display, and any product or component which comprises these display devices and has display function, such as TV, digital camera, mobile phone, tablet computer, watch, etc.

At least one embodiment of the present invention provides a method for preparing an OLED display device, which, as shown in FIG. 2, comprises the following steps 101-102.

Step 101. Forming a topological insulator into an anode pattern and/or a cathode pattern with a two-dimensional nanostructure.

When only the cathode of the OLED display device comprises the topological insulator with a two-dimensional nanostructure, the topological insulator only needs to be formed into a cathode pattern with a two-dimensional nanostructure. When only the anode of the OLED display device comprises the topological insulator with a two-dimensional nanostructure, the topological insulator only needs to be formed into an anode pattern with a two-dimensional nanostructure. When both the cathode and the anode of the OLED display device comprise the topological insulator with a two-dimensional nanostructure, the topological insulator is formed into a cathode pattern with a two-dimensional nanostructure and an anode pattern with a two-dimensional nanostructure.

By taking the formation of a cathode pattern with a two-dimensional nanostructure from the topological insulator as an example, the preparation method of the above step 101 is specially explained as follows, which, as shown in FIG. 3, comprises the following steps 1011-1013.

Step 1011: etching to pattern a substrate to form a pattern corresponding to the cathode.

For instance, the substrate may be mica or $SrTiO_3$ (111) or other substrate on the surface of which a topological insulator thin film can be grown by molecular beam epitaxy method. In this embodiment, the substrate is explained in detail by taking mica as an example.

Etching to pattern the substrate to form a pattern corresponding to the cathode may be conducted by plasma-etching the mica substrate under the masking of a mask plate which has the same shape as the cathode pattern, to obtain a mica substrate which has been patterned in correspondence to the cathode pattern.

Hereinabove, just the formation of the cathode pattern of the topological insulator with a two-dimensional nanostructure are taken as the example. For the formation of the anode pattern of the topological insulator with a two-dimensional nanostructure, reference is made to those specific explanations for forming the cathode pattern, and the embodiments of the present invention do not need to further describe that.

Step 1012: forming a thin film of the topological insulator with a two-dimensional nanostructure on the surface of the substrate that is patterned.

For example, a thin film of $Bi_2Se_3$ is grown on a surface of the patterned mica substrate by molecular beam epitaxy method. Other topological insulator thin films can also be grown. In this embodiment, the topological insulator is explained in detail by taking $Bi_2Se_3$ as an example.

Step 1013: removing the substrate to obtain the cathode pattern.

The mica substrate is dissolved to obtain a cathode pattern of the topological insulator with a two-dimensional nanostructure.

Step 102: forming an anode, an organic functional layer and a cathode, wherein forming of the anode and/or cathode is conducted by adhering the anode pattern and/or the cathode pattern on the correspondent anode zone and/or cathode zone by an adhesive layer.

The anode pattern of the topological insulator with a two-dimensional nanostructure may be adhered on the anode zone by an adhesive layer, and the cathode may be made of metals. This is an example wherein only the anode comprises the topological insulator with a two-dimensional nanostructure. Alternatively, the cathode pattern of the topological insulator with a two-dimensional nanostructure may be adhered on the cathode zone by an adhesive layer, and the anode may be made of metals. This is an example wherein only the cathode comprises the topological insulator with a two-dimensional nanostructure. Alternatively, the anode pattern of the topological insulator with a two-dimensional nanostructure may be adhered on the anode zone by an adhesive layer, and the cathode pattern of the topological insulator with a two-dimensional nanostructure may be adhered on the cathode zone by an adhesive layer. This is an example wherein both the cathode and the anode are the topological insulator with a two-dimensional nanostructure.

For example, the method further comprises forming a thin film transistor before the above step 102, i.e., before forming of the anode, the organic functional layer and the cathode.

Forming the thin film transistor specially comprises forming a gate electrode, a source electrode and a drain electrode.

The cathode is electrically connected with the drain electrode of the thin film transistor, and the anode may be formed in the following manner: forming a first adhesive layer; adhering the anode pattern on the anode zone by the first adhesive layer. Alternatively, the anode is electrically connected with the drain electrode of the thin film transistor, and the cathode may be formed in the following manner: forming a second adhesive layer; adhering the cathode pattern on the cathode zone by the second adhesive layer.

The electrode which is electrically connected with the drain electrode may be metal electrode or ITO electrode, etc.; and the electrode which is not electrically connected with the drain electrode may be the topological insulator with a two-dimensional nanostructure.

For example, the first adhesive layer may be formed in the following manner: forming a first adhesive layer on the surface of one side of the anode pattern. Thus adhering of the anode pattern on the anode zone by the first adhesive layer specially comprises adhering the anode pattern which is provided with the first adhesive layer on the anode zone of the base substrate.

Alternatively, the first adhesive layer may be formed in the following manner: forming a first adhesive layer on the anode zone of the base substrate. Thus adhering of the anode pattern on the anode zone by the first adhesive layer specially comprises adhering the anode pattern on the first adhesive layer.

For example, the second adhesive layer may be formed in the following manner: forming a second adhesive layer on the surface of one side of the cathode pattern. Thus adhering of the cathode pattern on the cathode zone by the second adhesive layer specially comprises adhering the cathode pattern which is provided with the second adhesive layer on the cathode zone of the base substrate.

Alternatively, the second adhesive layer may be formed in the following manner: forming a second adhesive layer on the cathode zone of the base substrate. Thus adhering the cathode pattern on the cathode zone by the second adhesive layer specially comprises adhering the cathode pattern on the second adhesive layer.

Hereinafter, a specific example is provided for explaining the method for preparing the display device provided by an embodiment of the present invention. As shown in FIG. 4, the method comprises the following steps 201-205:

Step 201: forming a thin film transistor.

For example, a gate electrode, an active layer and a source drain electrode are formed by a patternizing process.

Step 202: forming an anode which is electrically connected with the drain electrode of the thin film transistor.

The anode may be formed by forming a conductive metal oxide thin film from ITO and by a patternizing process.

Step 203: forming an organic functional layer.

For example, a hole transport functional layer (HTL layer), a hole injection functional layer (HIL layer), a light emitting functional layer (EML layer), an electron injection functional layer (EIL layer) and an electron transport functional layer (ETL layer) are formed.

Step 204: forming a cathode pattern of a topological insulator with a two-dimensional nanostructure.

For the formation of the cathode of the topological insulator with a two-dimensional nanostructure, reference may be made to the foregoing steps 1011-1013.

Step 205: forming an adhesive layer on the surface of one side of the cathode pattern, and adhering the cathode pattern which is provided with the adhesive layer on the cathode zone of the base substrate.

In the OLED display apparatus formed by the above steps 201-205, only the cathode comprises the topological insulator with a two-dimensional nanostructure. Of course, the above specific preparation steps are only provided as an example. For example, the above step 204 is carried out only before the step 205, and has no essential sequence relationship with other steps. The embodiments of the present invention are explained in detail by taking the above just for example.

The above description is merely exemplary embodiments which are not used for limiting the protection scope of the present invention which is, however, determined by the attached claims.

The present application claims the priority of the Chinese Patent Application No. 201410381309.X submitted on Aug. 5, 2014, and the content disclosed in the above Chinese patent application is incorporated by reference as part of this application.

What is claimed is:

1. An organic light emitting diode (OLED) display device, comprising a base substrate, an anode, a cathode and an organic functional layer, the anode, the cathode and the organic functional layer being formed on the base substrate, and the organic functional layer being located between the cathode and the anode,
wherein the anode and/or the cathode comprises a topological insulator with a two-dimensional nanostructure, and the topological insulator with the two-dimensional nanostructure is adhered on the base substrate by an adhesive layer.

2. The display device as defined according to claim 1, wherein the topological insulator comprises at least one selected from the group consisting of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, monolayer tin and a variant material of monolayer tin.

3. The display device as defined according to claim 2, wherein the variant material of monolayer tin is formed by surface-modifying or magnetic-doping the monolayer tin.

4. The display device as defined according to claim 2, wherein the variant material of monolayer tin is a tin fluorine compound formed by surface-modifying monolayer tin with fluorine atom.

5. The display device as defined according to claim 2, further comprising a thin film transistor, the thin film transistor comprising a gate electrode, a source electrode and a drain electrode;
wherein the cathode is connected electrically with the drain electrode of the thin film transistor, and the anode comprises the topological insulator with the two-dimensional nanostructure; or
the anode is connected electrically with the drain electrode of the thin film transistor, and the cathode comprises the topological insulator with the two-dimensional nanostructure.

6. The display device as defined according to claim 4, further comprising a thin film transistor, the thin film transistor comprising a gate electrode, a source electrode and a drain electrode;
wherein the cathode is connected electrically with the drain electrode of the thin film transistor, and the anode comprises the topological insulator with the two-dimensional nanostructure; or the anode is connected electrically with the drain electrode of the thin film transistor, and the cathode comprises the topological insulator with the two-dimensional nanostructure.

7. The display device as defined according to claim 3, further comprising a thin film transistor, the thin film transistor comprising a gate electrode, a source electrode and a drain electrode;
   wherein the cathode is connected electrically with the drain electrode of the thin film transistor, and the anode comprises the topological insulator with the two-dimensional nanostructure; or
   the anode is connected electrically with the drain electrode of the thin film transistor, and the cathode comprises the topological insulator with the two-dimensional nanostructure.

8. The display device as defined according to claim 1, further comprising a thin film transistor, the thin film transistor comprising a gate electrode, a source electrode and a drain electrode;
   wherein the cathode is connected electrically with the drain electrode of the thin film transistor, and the anode comprises the topological insulator with the two-dimensional nanostructure; or
   the anode is connected electrically with the drain electrode of the thin film transistor, and the cathode comprises the topological insulator with the two-dimensional nanostructure.

9. A display apparatus, comprising the OLED display device as defined according to claim 1.

10. The display apparatus according to claim 9, wherein the topological insulator comprises at least one selected from the group consisting of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, monolayer tin and a variant material of monolayer tin.

11. The display apparatus according to claim 10, wherein the variant material of monolayer tin is formed by surface-modifying or magnetic-doping the monolayer tin.

12. The display apparatus according to claim 10, wherein the variant material of monolayer tin is a tin fluorine compound formed by surface-modifying monolayer tin with fluorine atom.

13. The display apparatus according to claim 9, wherein the OLED display device further comprises a thin film transistor, the thin film transistor comprises a gate electrode, a source electrode and a drain electrode;
   the cathode is connected electrically with the drain electrode of the thin film transistor, and the anode comprises the topological insulator with the two-dimensional nanostructure; or
   the anode is connected electrically with the drain electrode of the thin film transistor, and the cathode comprises the topological insulator with the two-dimensional nanostructure.

* * * * *